(12) United States Patent
Jeong

(10) Patent No.: US 9,805,857 B2
(45) Date of Patent: Oct. 31, 2017

(54) METHOD OF MANUFACTURING A MULTILAYER TRANSFORMER PRINTED CIRCUIT BOARD (PCB) FOR AN ELECTRIC CAR

(71) Applicant: DODO TECH CO., LTD., Siheung-si (KR)

(72) Inventor: Chanboung Jeong, Incheon (KR)

(73) Assignee: Dodo Tech Co., Ltd, Siheung-si, Gyeonggi-Do (KR)

( * ) Notice: Subject to any disclaimer, the term of this patent is extended or adjusted under 35 U.S.C. 154(b) by 179 days.

(21) Appl. No.: 14/401,324

(22) PCT Filed: Sep. 15, 2014

(86) PCT No.: PCT/KR2014/008584
§ 371 (c)(1),
(2) Date: Nov. 14, 2014

(87) PCT Pub. No.: WO2015/119349
PCT Pub. Date: Aug. 13, 2015

(65) Prior Publication Data
US 2016/0284460 A1    Sep. 29, 2016

(30) Foreign Application Priority Data

Feb. 10, 2014 (KR) .......................... 10-2014-0014893

(51) Int. Cl.
*H01F 7/06* (2006.01)
*H01F 27/28* (2006.01)
(Continued)

(52) U.S. Cl.
CPC ...... *H01F 27/2804* (2013.01); *B60L 11/1809* (2013.01); *H01F 27/29* (2013.01);
(Continued)

(58) Field of Classification Search
CPC ........ H01F 5/02; H01F 17/02; H01F 27/2804; H01F 27/29; H01F 27/2895;
(Continued)

(56) References Cited

U.S. PATENT DOCUMENTS 5,754,088 A * 5/1998 Fletcher .............. H01F 27/2804
336/200
6,980,074 B1 * 12/2005 Jitaru .................. H01F 27/2804
336/200

(Continued)

FOREIGN PATENT DOCUMENTS

| JP | 2001102751 | 4/2001 |
| KR | 1019980025749 | 7/1998 |
| KR | 1020040111302 A | 12/2004 |

*Primary Examiner* — Paul D Kim
(74) *Attorney, Agent, or Firm* — Nixon Peabody LLP; David S. Resnick; David F. Crosby

(57) ABSTRACT

The present invention provides a multilayer transformer PCB structure for an electric car and manufacturing method for the same, which includes first and second connecting copper tabs horizontally formed in plural on both surfaces of a base substrate, thereby forming inner layer circuits coupled to battery cells, and third and fourth connecting copper tabs stacked on a top surface of the first connecting copper tab and a top surface of the second connecting copper tab by patterning process a copper material several times as a predetermined thickness, thereby forming outer layer circuits coupled to the battery cells. According to the present invention configured thus, the transformer PCB for an electric car has a structure in which a conductive material having a predetermined thickness is stacked in a multilayer form, and thus an increased quantity of charges to be treated is highly distributed, thereby maximizing current efficiency.

1 Claim, 8 Drawing Sheets

(51) Int. Cl.
  *H05K 1/16*   (2006.01)
  *B60L 11/18*  (2006.01)
  *H01F 27/29*  (2006.01)
  *H01F 41/04*  (2006.01)
  *H01F 41/12*  (2006.01)
  *H05K 3/46*   (2006.01)

(52) U.S. Cl.
  CPC ......... *H01F 41/043* (2013.01); *H01F 41/045* (2013.01); *H01F 41/127* (2013.01); *H05K 1/165* (2013.01); *H01F 2027/2809* (2013.01); *H05K 3/4611* (2013.01)

(58) Field of Classification Search
  CPC ...... H01F 41/043; H01F 41/045; H01F 41/06; H01F 41/127; H01L 23/645; H01L 29/82; Y10T 29/49002; Y10T 29/49208; Y10T 29/4902; Y10T 29/49155; Y10T 29/49204; Y10T 29/49071; Y10T 29/49073; Y10T 29/4913
  See application file for complete search history.

(56) References Cited

U.S. PATENT DOCUMENTS

| | | | |
|---|---|---|---|
| 7,872,561 B2* | 1/2011 | Matumoto | H01F 27/2804 336/200 |
| 9,190,204 B1* | 11/2015 | Cates, Jr. | H01F 27/2804 |

* cited by examiner

METHOD OF MANUFACTURING A MULTILAYER TRANSFORMER PRINTED CIRCUIT BOARD (PCB) FOR AN ELECTRIC CAR

CROSS-REFERENCE TO RELATED APPLICATIONS

This Application is a 35 U.S.C. §371 National Phase Entry Application of International Application No. PCT/KR2014/008584 filed Sep. 15, 2014, which designates the U.S., and which claims benefit under 35 U.S.C. §119 of Korea Application No. KR 10-2014-0014893, filed on Feb. 10, 2014, the contents of each of which are herein incorporated by reference in their entirety.

TECHNICAL FIELD

The present invention relates to a multilayer transformer printed circuit board (PCB) structure for an electric car and method for manufacturing a multilayer transformer PCB for the same, and more particularly, to a multilayer transformer PCB structure for an electric car capable of maximizing current efficiency due to be a structure of a multilayer transformer PCB by stacking a conductive material having a predetermined thickness in a multilayer form.

BACKGROUND ART

Generally, an electric car is a vehicle which is driven using electric power. Electric cars appeared in the end of the 1880s, and have been used as transport means like cars, trucks and buses etc. The electric cars are known to efficiently use kinetic energy of a vehicle through an electric car control device, in which a power storage unit is combined with an inverter configured to drive an electric motor of the electric car, mounted in the vehicle, and storage of surplus regenerative power generated upon braking of the vehicle in the power storage unit, which is then used upon acceleration of the vehicle or a decrease in line voltage. In particular, a battery management system (BMS), which functions to improve gas mileage and ensure safety by optimizing the control of batteries in the electric car, has been applied to and used in such electric cars. Also, BMS is realized on a PCB provided with a transformer module for use.

Referring to FIG. 1, such a conventional transformer PCB device for an electric car is configured to include a plurality of battery cells 70*a-n* configured to supply power to an electric car (not shown); transformer PCBs 71*a-n* mounted to be connected to the plurality of battery cells 70*a-n* in a serial or parallel electrocircuit mode; and a charging unit 72 mounted at the transformer PCBs 71*a-n* to rectify a supply voltage applied from the outside and apply the rectified supply voltage to the battery cells 70*a-n*.

In this case, a plastic is generally used as a material in the transformer PCBs 71*a-n*, and wires required for serial or parallel connection of the battery cells 70*a-n* are installed in the transformer PCBs 71*a-n*. Also, the respective electrocircuit connection between the transformer PCBs 71*a-n* and the battery cells 70*a-n* is performed by patterning copper tabs 73*a-n* on the transformers PCB 71*a-n*, as shown in FIG. 2. For example, the copper tabs 73*a-n* formed on such conventional transformer PCBs 71*a-n* are formed so that the Cu thickness is maintained with a thickness of 2 oz (70 µm) to 4 oz (140 µm) on both surfaces of a base substrate 74 of each of the transformer PCBs 71*a-n*.

Meanwhile, such a conventional transformer PCB device for an electric car is operated as follows. First, when a supply voltage is applied to the charging unit 72, the charging unit 72 functions to convert the applied supply voltage, for example, an alternating current voltage, into a given charging voltage, rectify the charging voltage, and charge the charging voltage in each of the battery cells 70*a-n* through electric circuits formed on the transformer PCBs 71*a-n* as copper tabs 73*a-n*. Then, the above-described charging voltage is applied to each of the battery cells 70*a-n* via the copper tabs 73*a-n* of the transformers PCB 71*a-n*, that is, the copper tabs 73*a-n* having a thickness of 2 oz (70 µm) or 4 oz (140 µm). In this case, an electric current of the supply voltage has a current behavior, and thus is supplied to each of the battery cells 70*a-n* by the copper tabs 73*a-n* of the transformer PCBs 71*a-n*, that is, the copper tabs 73*a-n* having a thickness of 2 oz (70 µm) or 4 oz (140 µm), followed by a conventional charging process.

However, such a conventional transformer PCB device for an electric car has a transformer PCB structure in which the copper tabs having a thickness of 2 oz (70 µm) or 4 oz (140 µm) are formed on both surfaces of a transformer PCB. Therefore, when battery cells are safely and effectively charged with a supply voltage, the plurality of transformer PCBs should be connected to each other for use. As a result, an increase in part insertion space, and thus an increase in weight may have a negative influence on the fuel efficiency of a vehicle. Further, when the copper tabs have different thicknesses, the high error rate or low production yield may be caused during a production process.

DISCLOSURE

Technical Problem

The present invention is designed to solve the problems of the prior art, and therefore it is an object of the present invention to provide a multilayer transformer PCB structure for an electric car and method for manufacturing a multilayer transformer PCB for the same capable of maximizing current efficiency due to a connecting conductive material stacked in a multilayer structure so that an inner layer and an outer layer of the transformer PCB for an electric car have the same thickness, and thus an increased quantity of charges to be treated is highly distributed in the presence of the connecting conductive material formed in a multilayer structure.

Also, it is another object of the present invention to provide a multilayer transformer PCB structure for an electric car and method for manufacturing a multilayer transformer PCB for the same capable of effectively preventing part noise upon driving of a transformer due to a part hole or a part-mounting position that may be separated by repeatedly performing a process of forming an outer layer on an inner layer of a transformer PCB in a multilayer structure and coating the outer layer with a photo solder resist (PSR) ink by PSR printing.

Technical Solution

To solve the above problem of the prior art, according to an aspect of the present invention, there is provided a multilayer transformer PCB structure for an electric car, which includes a base substrate formed of a predetermined material to form an basic layer of a transformer PCB, first and second connecting copper tabs horizontally formed in plural on both surfaces of the base substrate by patterning process a copper (Cu) material so that the copper (Cu) material has a thickness of 10 oz (360 μm), thereby forming inner layer circuits coupled to battery cells; third and fourth connecting copper tabs stacked on a top surface of the first connecting copper tab and a top surface of the second connecting copper tab by patterning process a copper (Cu) material several times so that the copper (Cu) material has a thickness of 10 oz (360 μm), thereby forming outer layer circuits coupled to the battery cells, According to another aspect of the present invention, there is provided a method of manufacturing a multilayer transformer PCB for an electric car, which includes a first process of cutting a source material of a transformer PCB for inner layers in a given standard size and constituting an inner layer circuit through a photosensitive film process, a second process of performing a black oxide process on the transformer PCB for inner layers having the inner layer circuit constituted therein after the first process, a third process of performing a lamination process by laminating a source material of an outer layer for an outer layer process on a top surface of the transformer PCB for inner layers having the inner layer circuit formed therein after the second process, a fourth process of cutting the source material of the outer layer laminated on the top surface of the transformer PCB for inner layers in a given standard size and constituting an outer layer circuit through a photosensitive film process after the third process, a fifth process of stacking the outer layer circuit on the top surface of the transformer PCB for inner layers having the inner layer circuit formed therein and coating the outer layer circuit with a PSR ink after the fourth process, and a sixth process of performing gold plating on the top surface of the transformer PCB having the inner and outer layers coated with the PSR ink, marking, and appearance processing, mounting various parts on the transformer PCB, and covering a case to finish the transformer PCB for an electric car after the fifth process.

Advantageous Effect

According to the exemplary embodiments of the present invention as described above, since the transformer PCB for an electric car is formed to have a structure in which a connecting conductive material having the same thickness is stacked in a multilayer form, an increased quantity of charges treated by the stacked structure of multiple layers is highly distributed as the connecting conductive material having the same thickness is stacked on the inner layer and the outer layer in a multilayer form. Therefore, the present invention can be useful in maximizing current efficiency, thereby remarkably improving charging efficiency of the battery cells.

Also, the present invention configured can thus be useful in separating a part hole or a part-mounting position by repeatedly performing a process of forming an outer layer on an inner layer of the transformer PCB in a multilayer form and coating the outer layer with a PSR ink by means of PSR printing while changing printing directions, thereby effectively preventing part noise upon transformer driving.

BEST MODE

Hereinafter, preferred embodiments of the multilayer transformer PCB structure for an electric car according to one exemplary embodiment of the present invention will be described with reference to the accompanying drawings.

However, the preferred embodiments of the multilayer transformer PCB structure for an electric car according to the present invention disclosed herein are not limited to the embodiments disclosed below, but can be implemented in various forms. The following embodiments described herein are provided in order to make the present invention more comprehensive and complete and provide the scope of the present invention to those skilled in the art. In this specification, like numbers refer to like elements throughout the description of the figures. Meanwhile, the terminology used herein is for the purpose of describing particular embodiments only and is not intended to be limiting of exemplary embodiments. In this specification, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

Embodiments

Figure 1:
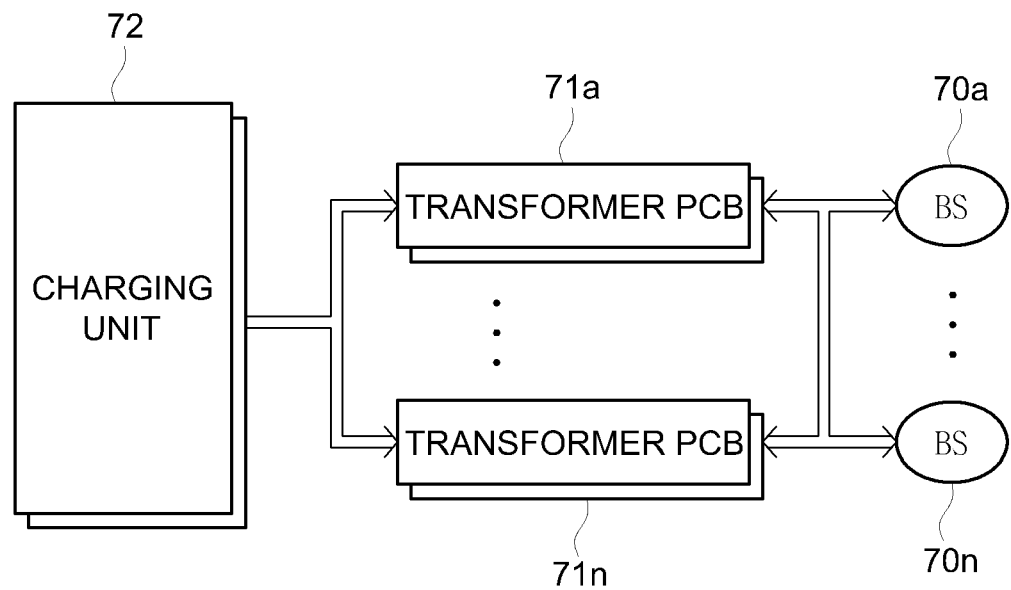
FIG. 1 is an explanatory diagram for simply explaining a conventional transformer PCB device for an electric car.
Figure 2:
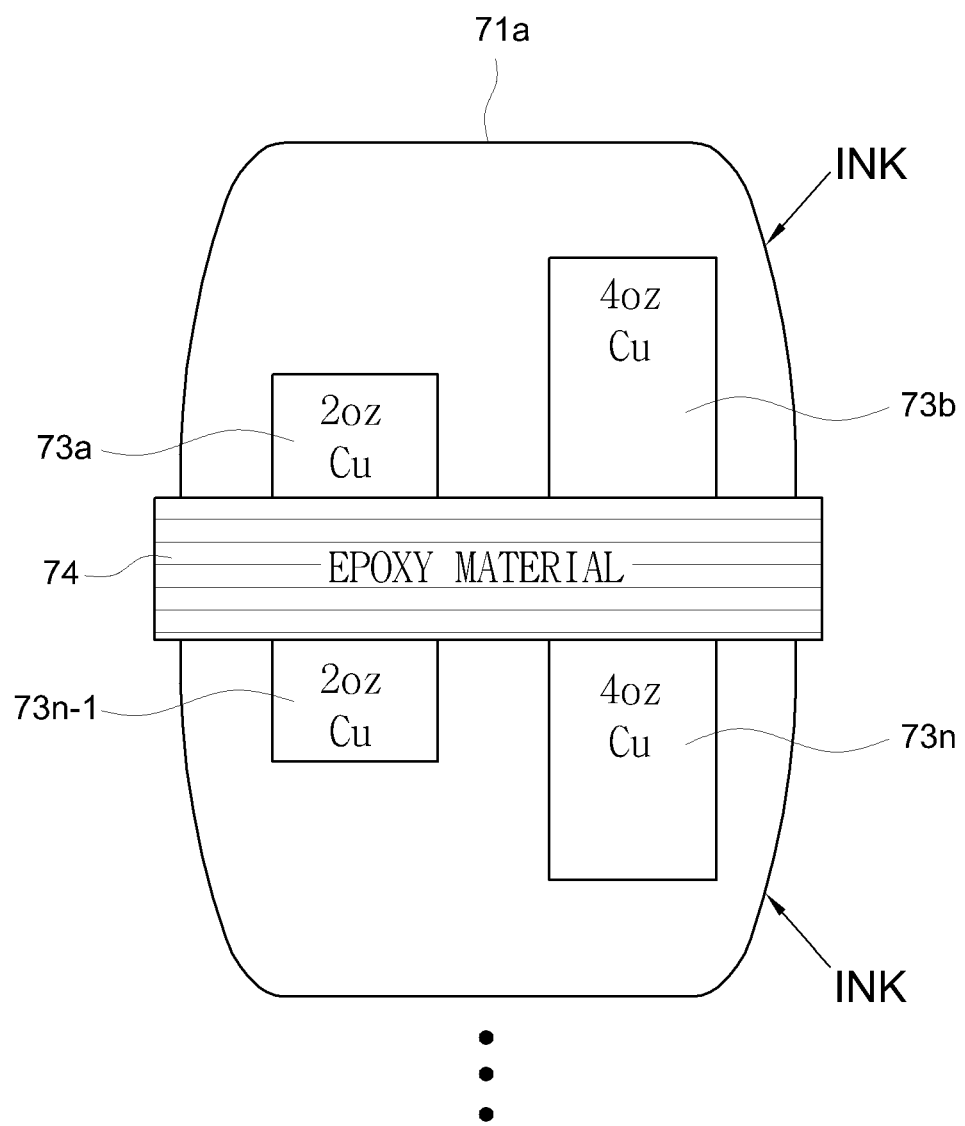
FIG. 2 is an explanatory diagram for schematically explaining a structure of the conventional transformer PCB device for an electric car.
Figure 3:
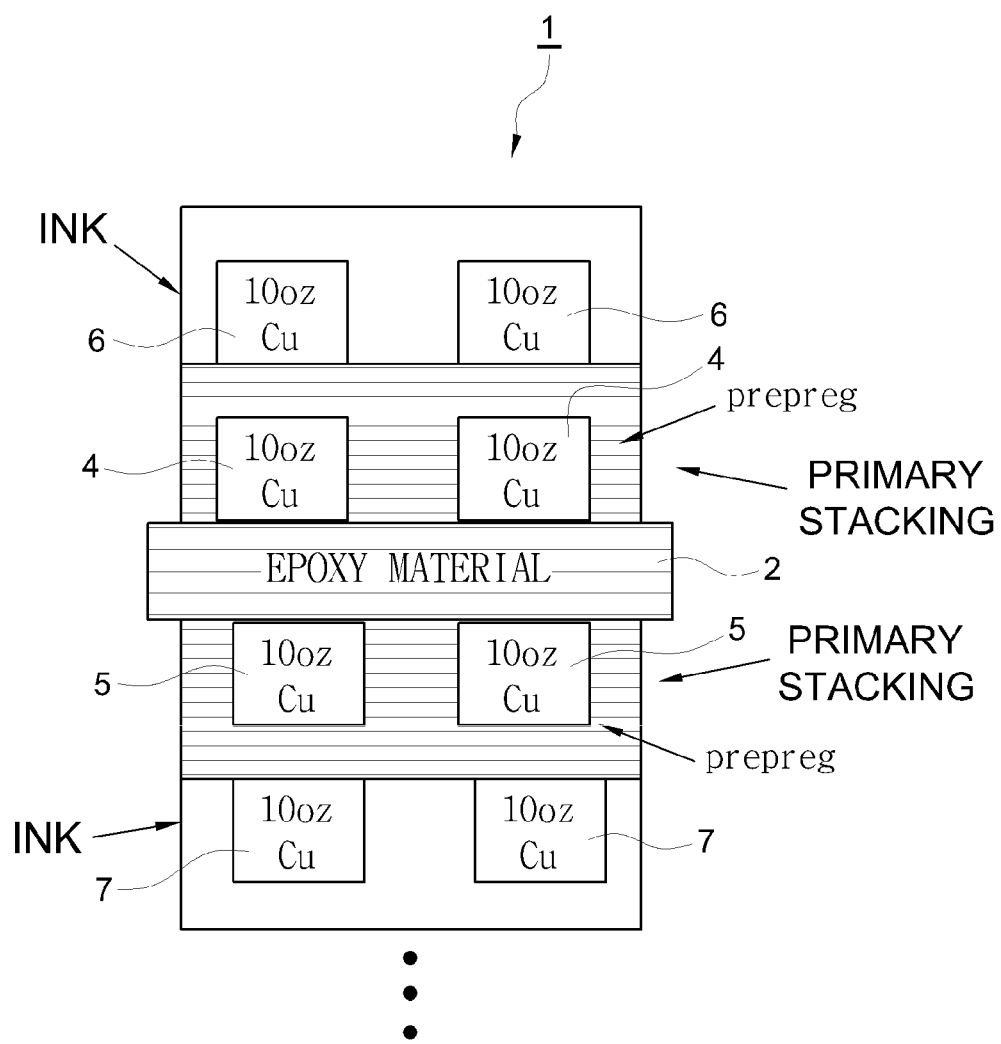
FIG. 3 is an explanatory diagram for schematically explaining a multilayer transformer PCB structure for an electric car.
Figure 4:
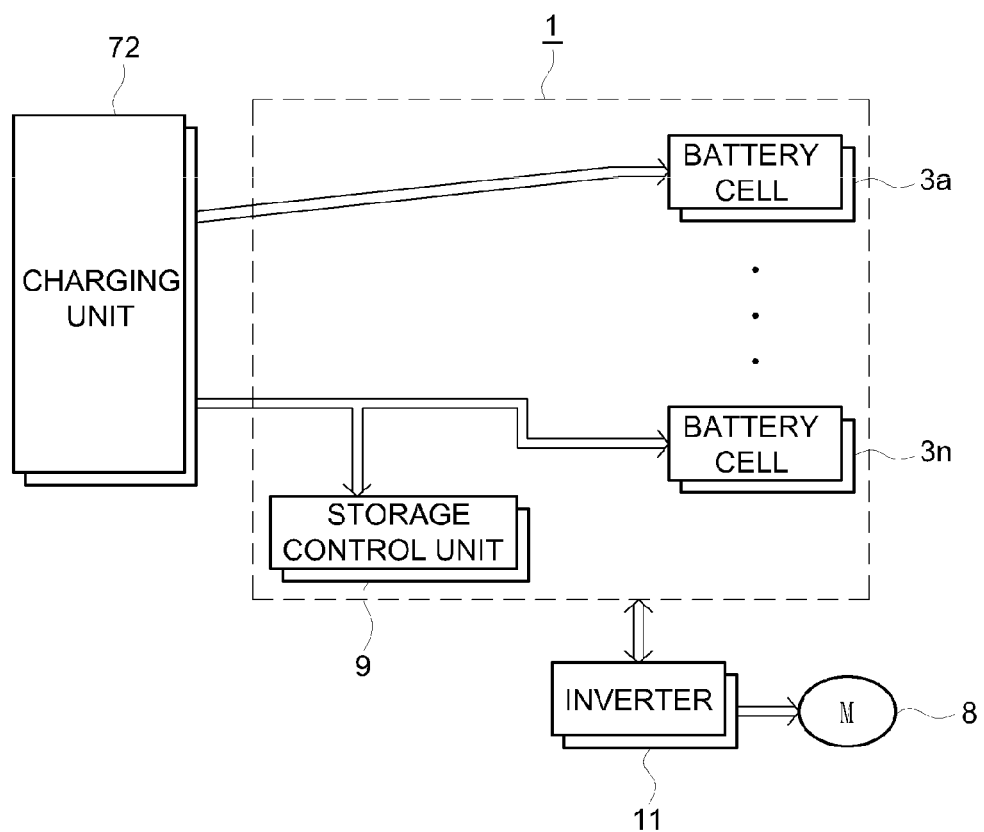
FIG. 4 is a flowchart illustrating a method of manufacturing a multilayer transformer PCB for an electric car according to one exemplary embodiment of the present invention.
Figure 5:
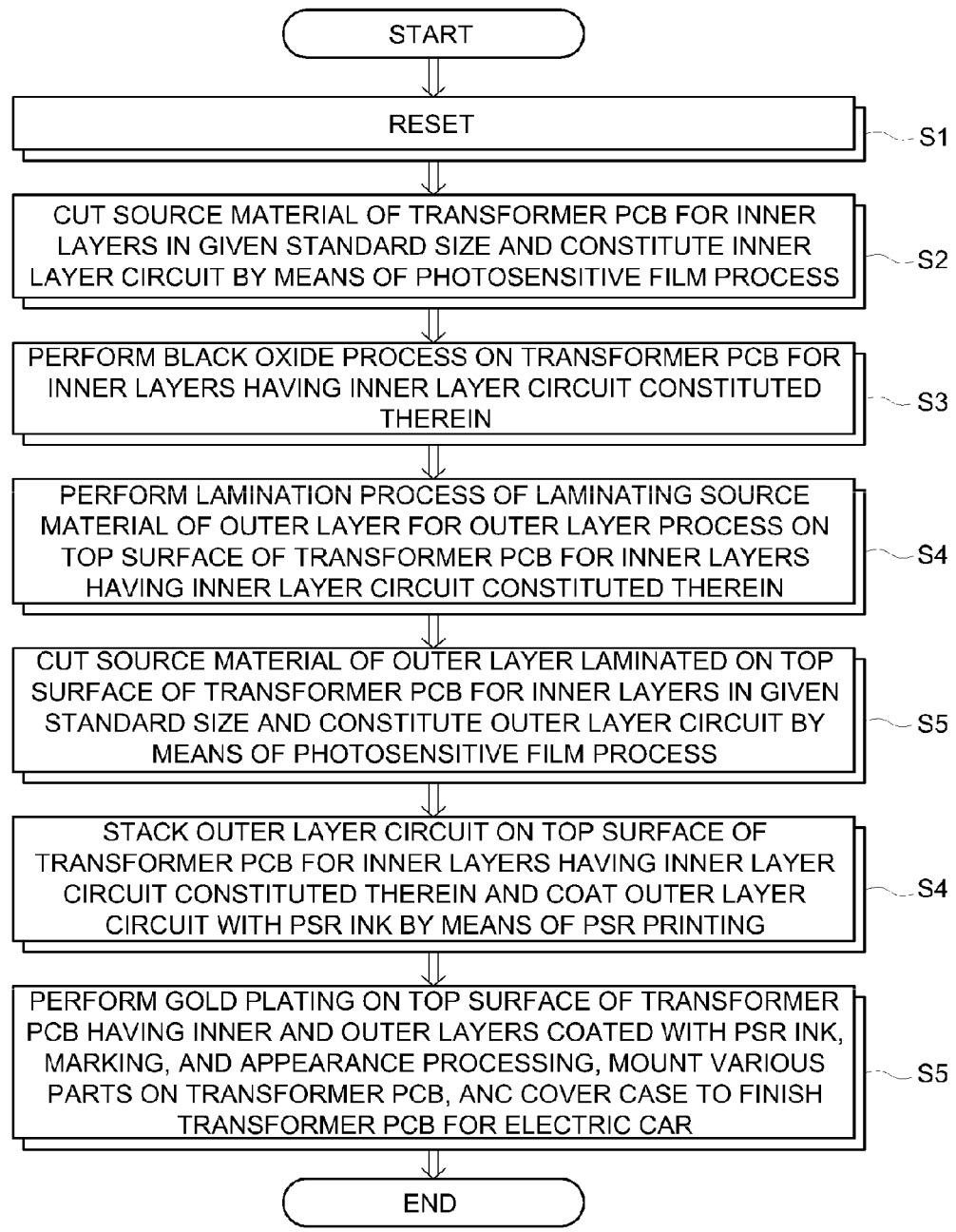
FIG. 5 is a flowchart according to one exemplary embodiment of the present invention.
Figure 6:
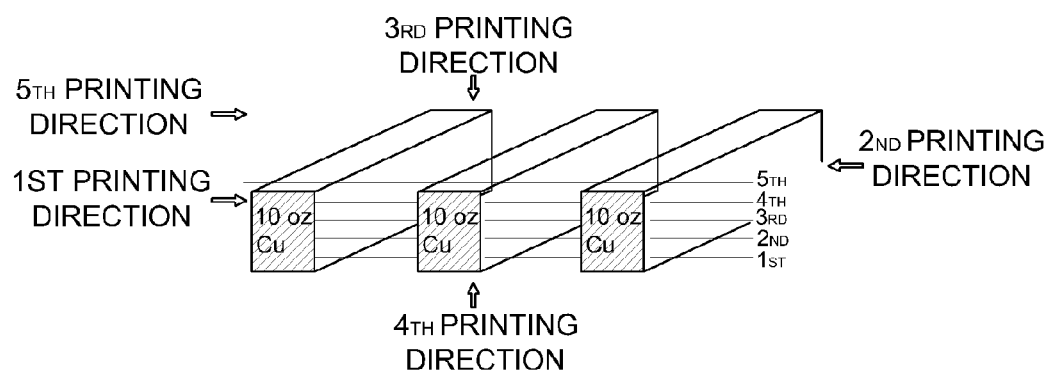
FIG. 6 is an explanatory diagram for explaining a PSR process in the manufacturing method according to one exemplary embodiment of the present invention.
Figure 7:
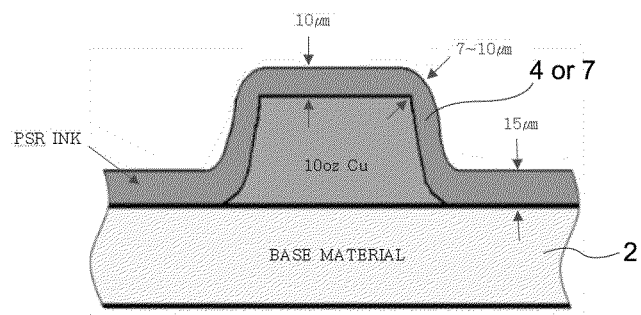
FIG. 7 is an explanatory diagram for explaining one exemplary embodiment of the PSR process of the present invention.
Figure 8:
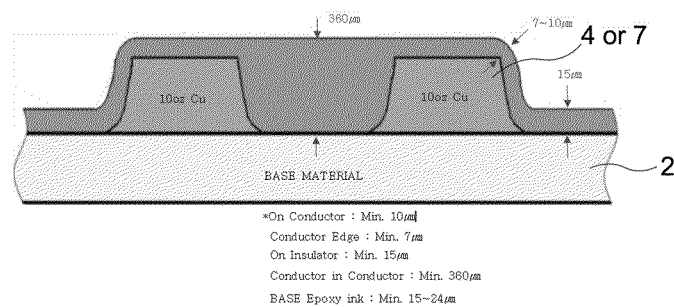
FIG. 8 is an explanatory diagram for explaining another exemplary embodiment of the PSR process of the present invention.

FIG. 2 is an explanatory diagram for schematically explaining a structure of a conventional transformer PCB device for an electric car, FIG. 3 is an explanatory diagram for schematically explaining a multilayer transformer PCB structure for an electric car, FIG. 4 is a flowchart illustrating a method of manufacturing a multilayer transformer PCB for an electric car according to one exemplary embodiment of the present invention, FIG. 5 is a flowchart according to one exemplary embodiment of the present invention, FIG. 6 is an explanatory diagram for explaining a PSR process in the manufacturing method according to one exemplary embodiment of the present invention, FIG. 7 is an explanatory diagram for explaining one exemplary embodiment of the PSR process of the present invention, and FIG. 8 is an explanatory diagram for explaining another exemplary embodiment of the PSR process of the present invention.

As shown in FIG. 3, the multilayer transformer PCB structure for an electric car according to one exemplary embodiment of the present invention includes a base substrate 2 formed of a predetermined material, for example, an epoxy material, to form an basic layer of a transformer PCB 1, first and second connecting copper tabs 4 and 5 horizontally formed in plural on both surfaces of the base substrate 2 by patterning process a copper (Cu) material so that the copper (Cu) material has a predetermined thickness, thereby forming inner layer circuits coupled to battery cells 3a-n, and third and fourth connecting copper tabs 6 and 7 stacked on a top surface of the first connecting copper tab 4 and a top surface of the second connecting copper tab 5 by patterning process a copper (Cu) material several times so that the copper (Cu) material has a predetermined thickness, thereby forming outer layer circuits coupled to the battery cells 3a-n.

Here, a process of primarily stacking a prepreg (forming a prepreg layer) on a top surface of each of the first connecting copper tab 4 and the second connecting copper tab 5 is performed before stacking the third connecting copper tab 6 and the fourth connecting copper tab 7. In this case, an epoxy resin and a core may be used as a prepreg stacking material. That is, the prepreg layers are further formed between the first connecting copper tab and the third connecting copper tab, and between the second connecting copper tab and the fourth connecting copper tab.

Also, each of the first to fourth connecting copper tabs 4 to 7 is formed to have the same thickness of 10 oz (360 μm).

Further, a PSR printing process of stacking an outer layer on a top surface of the inner layer and repeatedly coating the outer layer with a PSR ink by means of PSR printing while changing printing directions (i.e., a process of forming a PSR-printed layer) is performed. That is, the multilayer transformer PCB structure for an electric car according to one exemplary embodiment of the present invention further includes a PSR-printed layer obtained by repeatedly coating the top surface of the outer layer with the PSR ink by means of PSR printing while changing printing directions.

As shown in FIG. 4, an electric car in which the multilayer transformer PCB according to one exemplary embodiment of the present invention described above is mounted also includes a plurality of battery cells 3a-n coupled to multilayer transformer PCBs 1 via first to the fourth connecting copper tabs 4 to 7, all of which are made of a conductive material, in an electrocircuit mode to supply power to an electric motor 8 of the electric car through an inverter 11; a storage control unit 9 configured to control a current capacity flowing via the first to fourth connecting copper tabs 4 to 7 and a charging/discharging voltage supplied to the plurality of battery cells 3a-n by controlling switching of electrocircuit connection paths of the first to fourth connecting copper tabs 4 to 7 of the multilayer transformer PCB 1; and a charging unit 10 configured to rectify a supply voltage applied from the outside and apply the supply voltage to the battery cells 3a-n according to a function control signal of the storage control unit 9.

Therefore, the multilayer transformer PCB 1 according to one exemplary embodiment of the present invention described above performs the functions of a conventional BMS through the storage control unit 9. Such a BMS functions to monitor the voltage, electric current and temperature of the multilayer transformer PCB 1 and maintain and manage the voltage, electric current and temperature of the multilayer transformer PCB 1 under optimal conditions, and to take action on alerts and preliminary safety precautions for safe operation of the multilayer transformer PCB 1. Also, since the storage control unit 9 prevents overcharging and overdischarging during charging/discharging of the battery cells 3a-n and uniformly applies a voltage between cells, the multilayer transformer PCB 1 may function to store the alert-related history states and analyze the related history states using an external diagnostic system and a monitoring PC by preserving the data and analyzing the multilayer transformer PCB 1 while increasing the energy efficiency and battery life span.

Next, the manufacturing method according to one exemplary embodiment configured thus will be described.

As shown in FIG. 5, the method according to one exemplary embodiment of the present invention is configured to include a first step (S2) of cutting a source material of the transformer PCB for inner layers in a given standard size in a reset state (S1) and constituting an inner layer circuit by means of a conductive patterning process including a photosensitive film process; a second step (S3) of performing a black oxide process on the transformer PCB for inner layers having the inner layer circuit constituted therein after the first step (S2); a third step (S4) of performing a lamination process by laminating a source material of an outer layer for an outer layer process on a top surface of the transformer PCB for inner layers having the inner layer circuit constituted therein after the second step (S3); a fourth step (S5) of cutting the source material of the outer layer laminated on the top surface of the transformer PCB for inner layers in a given standard size and constituting an outer layer circuit by means of a conductive patterning process including a photosensitive film process after the third step (S4); a fifth step (S6) of repeatedly coating the outer layer circuit with a PSR ink by means of PSR printing while changing printing directions in a state in which the outer layer circuit is stacked on a top surface of the transformer PCB for inner layers having the inner layer circuit formed therein by means of the first step (S2) to the fourth step (S5); and a sixth step (S7) of performing gold plating on the top surface of the transformer PCB having the inner and outer layers coated with the PSR ink, marking, and appearance processing, mounting various parts on the transformer PCB, and covering a case to finish the transformer PCB for an electric car after the fifth step (S6).

Also, the first step (S2) further includes an inner layer circuit connection operation of horizontally forming first and second connecting copper tabs in plural numbers on both surfaces of a base substrate of the transformer PCB using a copper (Cu) material so that the copper (Cu) material has a thickness of 10 oz (360 μm), and connecting battery cells to inner layer circuits via the first and second connecting copper tabs formed as described above.

In addition, the fourth step (S5) further includes an outer layer circuit connection operation of horizontally forming third and fourth connecting copper tabs in plural numbers on a source material of the outer layers laminated on both top surfaces of the transformer PCB for inner layers using a copper (Cu) material so that the copper (Cu) material has a thickness of 10 oz (360 μm), and connecting the battery cells to outer layer circuits via the third and fourth connecting copper tabs formed as described above.

Further, the first step (S2) further includes a process of bringing a photosensitive film into close contact with the source material of the transformer PCB for inner layers cut in a given standard size in order to form a circuit diagram according to specifications on the source material of the transformer PCB for inner layers cut in a given standard size, developing the photosensitive film (forming a circuit diagram), and removing the residual dry film.

Also, the second step (S3) further includes a first short checking operation (i.e., an automated optical inspection (AOI) operation) of checking for short circuits in the transformer PCB for inner layers having the inner layer circuit constituted therein.

Here, the black oxide process is performed on the transformer PCB for inner layers having the inner layer circuit constituted therein in the second step (S3) because the surface of transformer PCB for inner layers is roughened by oxidization using a chemical reaction in order to enhance adhesion prior to stacking the inner layer and outer layer circuits.

In addition, the fourth step (S5) is further performed after the third step (S4). Here, the fourth step (S5) includes a drilling process of processing a hole according to specifications to allow electric current to flow through first, second, third and fourth layers; a desmear process of removing an epoxy resin attached to an inner wall of the hole or attached between the Cu surfaces using potassium permanganate (chemical name), wherein the epoxy resin is attached to the inner wall of the hole or between the Cu surfaces due to a friction force generated between a drill bit and the inner wall of the hole and the Cu surfaces during the drilling process; and a plating process of performing chemical plating, electroplating, or panel plating on the processed hole (a current density of 1.8 to 1.9 am/dm$^2$; electroplated for approximately 100 minutes) after the drilling process, wherein the chemical plating, electroplating, or panel plating is performed to convert the non-conductive processed hole into a conductive hole, and also performed at a low electric current in order to maintain a copper-plated film at a thickness of approximately 25 m/m since the source material has a thickness of 2.0 to 2.4 m/m in a panel plating process.

Meanwhile, in the fourth step (S5), the circuit and hole are formed to have a Cu thickness of 10 oz (360 µm) using the same process such as the inner layer process so as to protect the processed hole. In this case, since the processed hole is plated as a non-conductive hole, the non-conductive hole is converted into the conductive hole. Therefore, a photosensitive dry film forming a circuit is used at a thickness of 50 µm rather than 40 µm. In this procedure, when the processed hole is damaged in use of the dry film having a thickness of 40 µm as described above, an etching solution permeates into the inner wall of the hole and causes corrosion of a Cu-plated region on the inner wall of the hole. Thus, the corresponding processes should be thoroughly managed, and a process of removing a photosensitive film (i.e., a dry film having a thickness of 50 µm) should be performed after the photosensitive dry film (i.e., a dry film having a thickness of 50 µm) is brought into close contact and developed (circuit formation) and an etching process is performed three times (the circuit formation is completed). Also, the fourth step (S5) further includes a second short checking operation (i.e., an AOI operation) of checking for short circuits in the outer layer circuit of the transformer PCB for outer layers stacked on the inner layer.

Here, in the PSR coating process, the outer layer circuit stacked on the top surface of the inner layer circuit may be coated with the PSR ink, thereby preventing noise of parts and separating a part hole or a part-mounting position. That is, the PSR coating process will be described in further detail below. For example, as shown in FIG. 6, a PSR ink is filled between circuits while changing the 1$^{st}$ to 5$^{th}$ printing angles (a both-way printing process) in a printing machine (not shown), and printed under the following working conditions: repeatedly performed five times at a temperature of 120° C., pre-cured once to five times for 40 minutes, and post-cured five times at 120° C. for 110 minutes using a 100 mesh plate (a printing film).

In addition, when the hole into which the parts are inserted is plated with gold having the highest current efficiency in the sixth step (S7), the most ideal electric current efficiency may be maintained after insertion of the parts by plating the top surfaces of the first to fourth connecting copper tabs 4 to 7 with nickel (Ni) and gold (Au) at thicknesses of 3 to 5 µm and 0.03 to 0.05 µm, respectively. In the sixth step (S7), mark printing, appearance processing and the like may be performed, an automated reliability BBT test may be performed to verify reliability of products, and a visual inspection and a packaging shipment process (an automated test line) may be finally performed.

That is, to manufacture a high-efficiency transformer PCB for an electric car according to one exemplary embodiment of the present invention, first, a source material (raw material) for manufacturing a PCB, a base copper source material (Cu=10 oz), and a prepreg source material are purchased (custom-built for special specifications). Then, the processes of cutting a source material for inner layers in a standard size required for item working, bringing a photosensitive film into close contact with the source material of the transformer PCB for inner layers cut in a given standard size in order to form a circuit diagram according to specifications on the source material of the transformer PCB for inner layers, developing the photosensitive film (forming a circuit diagram), and removing the residual dry film are performed. In this case, the first and second connecting copper tabs 4 and 5 are horizontally formed in plural numbers on both surfaces of the base substrate 2 of the transformer PCB 1 using a copper (Cu) material, so that the copper (Cu) material has a thickness of 10 oz (360 µm), and the inner layer circuits are coupled to the battery cells 3*a-n*. Then, a black oxide process is performed on the transformer PCB for inner layers having the inner layer circuit constituted therein as described above. The black oxide process is performed in this way because the surface of the transformer PCB for inner layers is roughened by oxidization using a chemical reaction in order to enhance adhesion prior to stacking the inner layer and outer layer circuits. Also, an AOI process of checking for short circuits in the transformer PCB for inner layers having the inner layer circuit constituted therein as described above is performed.

Meanwhile, a lamination process of laminating a source material of the outer layer source for an outer layer process on a top surface of the transformer PCB 1 for inner layers having the inner layer circuit constituted therein is performed after the above-described process. After the lamination process, a hole is also processed according to specifications by a drilling process to allow electric current to flow through first, second, third and fourth layers, and a desmear process is performed to remove an epoxy resin attached to an inner wall of the hole or attached between the Cu surfaces using the chemical potassium permanganate, wherein the epoxy region is attached to the inner wall of the hole or attached between the Cu surfaces due to a friction force generated between a drill bit and the inner wall of the hole and the Cu surfaces during the drilling process. Then, a plating process of performing chemical plating, electroplating, or panel plating on the processed hole (a current density of 1.8 to 1.9 am/dm$^2$; electroplated for approximately 100 minutes) is further performed after the drilling process. In this case, the chemical plating, electroplating, or panel plating is performed after the drilling process to convert the non-conductive processed hole into a conductive hole. The plating process is performed at a low electric current in order to maintain a copper-plated film at a thickness of approximately 25 m/m since the source material has a thickness of 2.0 to 2.4 m/m in a panel plating process.

In addition, after the source material of the outer layer is laminated on the top surface of the transformer PCB for inner layers as described above, the source material of the outer layer is cut in a given standard size, and an outer layer circuit is constituted by means of a photosensitive film process. Then, the outer layer circuit is stacked on the top surface of the transformer PCB for inner layers having the inner layer circuit formed therein according to the lamination process as described above, and is repeatedly coated with a PSR ink by means of PSR printing while changing printing directions (see FIGS. 7 and 8). That is, the third and fourth connecting copper tabs 6 and 7 are horizontally formed in plural numbers on the source materials of the outer layers laminated on both top surfaces of the transformer PCB 1 for inner layers formed thus using a copper (Cu) material so that the copper (Cu) material has a thickness of 10 oz (360 μm), and the outer layer circuits are connected to the battery cells 3a-n.

Here, in the PSR printing process, the circuit and hole are formed to have a Cu thickness of 10 oz (360 μm) using the same process such as the inner layer process so as to protect the processed hole. In this case, since the processed hole is plated as a non-conductive hole, the non-conductive hole is converted into the conductive hole. Therefore, a photosensitive dry film forming a circuit is used at a thickness of 50 μm rather than 40 μm. In this procedure, when the processed hole is damaged in use of the dry film having a thickness of 40 μm as described above, an etching solution permeates into the inner wall of the hole and causes corrosion of a Cu-plated region on the inner wall of the hole. Thus, the corresponding processes should be thoroughly managed, and a process of removing a photosensitive film (i.e., a dry film having a thickness of 50 μm) should be performed after the photosensitive dry film (i.e., a dry film having a thickness of 50 μm) is brought into close contact and developed (circuit formation) and an etching process is performed three times (the circuit formation is completed). That is, in the PSR coating process, the outer layer circuit stacked on the top surface of the inner layer circuit may be coated with the PSR ink, thereby preventing noise of parts and separating a part hole or a part-mounting position. That is, the PSR coating process will be described in further detail, as follows. For example, as shown in FIG. 6, a PSR ink is filled between circuits while changing the $1^{st}$ to $5^{th}$ printing angles (a both-way printing process) in a printing machine (not shown), and printed under the following working conditions: repeatedly performed five times at a temperature of 120° C., pre-cured one to five times for 40 minutes, post-cured five times at 120° C. for 110 minutes using a 100 mesh plate (a printing film). After the PSR coating process, the outer layer circuit of the transformer PCB for outer layers stacked on the inner layer is also checked for short circuits. Meanwhile, after the outer layer circuit is stacked on the inner layer as described above, gold plating is performed on the top surface of the transformer PCB having the inner and outer layers coated with the PSR ink, and marking and appearance processing are performed. Then, various parts are mounted on the transformer PCB, and a case is covered to finish the transformer PCB for an electric car.

Meanwhile, in the transformer PCB for an electric car manufactured by the method according to one exemplary embodiment of the present invention as described above, when a supply voltage is first applied to the charging unit 10, the charging unit 10 converts the applied supply voltage, for example, an alternating current voltage, into a given charging voltage, rectifies the charging voltage and fills the battery cells 3a-n with the rectified charging voltage by means of the inner layer and outer layer circuits formed on the transformer PCBs 1a-n as the first to fourth connecting copper tabs 4 to 7. That is, such a charging voltage is applied to the battery cells 3a-n via the first to fourth connecting copper tabs 4 to 7 of the transformer PCB 1, that is, copper tabs of the inner and outer layers having a thickness of 10 oz (360 μm). In this case, since the first to fourth connecting copper tabs 4 to 7 of the transformer PCB 1 are formed as the inner and outer layers having a thickness of 10 oz (360 μm), the electric current of the supply voltage flows at a large quantity so that the electric current is rapidly supplied to the respective battery cells 3a-n. In this case, the storage control unit 9 controls a current capacity flowing via the first to fourth connecting copper tabs 4 to 7 by controlling switching of electrocircuit connection paths of the first to fourth connecting copper tabs 4 to 7 of the multilayer transformer PCB 1.

INDUSTRIAL APPLICABILITY

According to one exemplary embodiment of the present invention, the transformer PCB for an electric car has a structure in which a conductive material having a predetermined thickness is stacked in a multilayer form, and thus can be applied to a multilayer transformer PCB structure for an electric car capable of maximizing current efficiency and a method of manufacturing a multilayer transformer PCB for an electric car.

| (Brief Description of Major Parts in the Drawings) | |
|---|---|
| 1: transformer PCB | 2: base substrate |
| 3a-n: battery cells | 4: first connecting copper tab |
| 5: second connecting copper tab | 6: third connecting copper tab |
| 7: fourth connecting copper tab | 8: electric motor |
| 9: storage control unit | 10: charging unit |
| 11: inverter | |

The invention claimed is:

1. A method of manufacturing a multilayer transformer printed circuit board (PCB) for an electric car, comprising:
    a first step of cutting a source material for inner layer of the transformer PCB to a given standard size and forming an inner layer circuit on the cut source material through a conductive patterning process including a photosensitive film process;
    a second step of performing a black oxide process on the inner layer circuit of the transformer PCB after the first step;
    a third step of performing a lamination process including laminating a source material forming an outer layer on top of the inner layer circuit formed on the inner layer of the transformer PCB after the second step;
    a fourth step of cutting the source material of the outer layer laminated on top of the inner layer of the transformer PCB to a given standard size and forming an outer layer circuit through a conductive patterning process including a photosensitive film process after the third step;
    a fifth step of forming a photo solder resist (PSR)-printed layer coated with a PSR ink along each of the 1st, 2nd, 3rd, 4th and 5th printing directions on a top surface of the outer layer circuit on the top of the transformer PCB formed thereon by the first step to the fourth step; and a sixth step of performing gold plating on at least a portion of the outer layer circuit on the top of the transformer PCB having the PSR-printed layer formed thereon, and marking, and appearance processing, mounting various parts on the transformer PCB to finish the transformer PCB for an electric car after the fifth step wherein the first step further comprises:

an inner layer circuit connection operation of horizontally forming first and second connecting copper tabs on both surfaces of the inner layer of the transformer PCB using a copper material so that the copper material has a thickness of 360 μm, and connecting battery cells to inner layer circuits, wherein the fourth step further comprises:

an outer layer circuit connection operation of horizontally forming third and fourth connecting copper tabs on both surfaces of the outer layers laminated to the inner layers of the transformer PCB using a copper material so that the copper material has a thickness of 360 μm, and connecting the battery cells to outer layer circuits, and wherein the sixth step further comprises:

a plating operation of plating top surfaces of the first, second, third, and fourth connecting copper tabs with nickel at a thicknesses of 3 to 5 μm and gold at a thicknesses of 0.03 to 0.05 μm.

\* \* \* \* \*